United States Patent [19]

Sakurai et al.

[11] Patent Number: 4,984,132
[45] Date of Patent: Jan. 8, 1991

[54] MULTILAYER WIRING SUBSTRATE

[75] Inventors: Akihiro Sakurai; Yutaka Watanabe, both of Hadano, Japan

[73] Assignee: Hitachi, Ltd., Tokyo, Japan

[21] Appl. No.: 388,961

[22] Filed: Aug. 2, 1989

[30] Foreign Application Priority Data

Aug. 10, 1988 [JP] Japan .................. 63-198055

[51] Int. Cl.$^5$ .............................................. H05K 1/14
[52] U.S. Cl. ...................................... 361/414; 174/266; 361/410; 439/65
[58] Field of Search .............................. 439/65, 68, 69; 174/250, 260, 261, 262, 266; 361/396, 407, 409, 410, 414

[56] References Cited

U.S. PATENT DOCUMENTS

| | | | |
|---|---|---|---|
| 4,322,778 | 3/1982 | Barbour | 361/414 |
| 4,553,111 | 11/1985 | Barrow | 333/1 |
| 4,560,962 | 12/1985 | Barrow | 333/1 |
| 4,616,292 | 10/1986 | Sengoku | 361/414 |
| 4,628,411 | 12/1986 | Balderes | 361/414 |
| 4,685,033 | 8/1987 | Inoue | 361/414 |

FOREIGN PATENT DOCUMENTS 57-106062 7/1982 Japan.
60-22394 2/1985 Japan.

Primary Examiner—Gerald P. Tolin
Attorney, Agent, or Firm—Fay, Sharpe, Beall, Fagan, Minnich & McKee

[57] ABSTRACT

A module substrate which mounts a plurality of electronic parts on the surface thereof and in which the voltage is uniformalized at power source feeding pads connected to the electronic parts. Pins for receiving an external power source are formed on the back surface of the module substrate. The module substrate includes a spreading conductor layer to which the power source is connected via pins and which is spread over the whole module, a plurality of uniformalizing conductor layers are connected to the feeding pads on the surface of the substrate via the through-holes and that are provided independently for each of the electronic parts. A plurality of resistance means have ends on one side connected to the plurality of uniformalizing conductor layers, and have ends on the other side connected to the spreading conductor layer. The resistance means have resistances determined in advance depending upon the power consumption of the electronic parts corresponding to the uniformalizing conductor layers.

9 Claims, 2 Drawing Sheets

MULTILAYER WIRING SUBSTRATE

DESCRIPTION

1. Technical Field

The present invention relates to a multilayer wiring substrate for mounting electronic parts such as LSI's. More specifically, the invention relates to a ceramic multilayer wiring substrate adapted for mounting electronic parts such as LSI's that consume large amounts of electric power.

2. Background Art

A multilayer wiring substrate can be represented by a multi-chip module which has a ceramic substrate obtained by laminating and sintering green sheets on which power source (inclusive of ground) wiring is printed. The substrate is further formed having through-hole wiring for interlayer connection. A plurality of input/output terminal pins connected to the through-hole wiring are brazed onto the back surface of the ceramic substrate, and many LSI's are mounted on the front surface. Provided in the substrate are mutual connections among many LSI terminals, as well as through-holes and internal wiring for connection among the LSI terminals and the input/output terminals.

In the multilayer wiring aluminum ceramic substrate obtained by laminating the green sheets, the wiring material is composed of a refractory metal such as tungsten or molybdenum that does not melt even at temperatures of 1500° C. to 1600° C. encountered at the time of sintering the ceramic. The only difficulty, however, is that these metals have greater electric resistances than those of gold and copper which have low melting points.

According to a ceramic multilayer wiring substrate disclosed in Japanese Patent Laid-Open No. 106062/1982, the power-source layer is independently provided for each of the LSI regions. The LSI's have so far consumed electric power in relatively small amounts with correspondingly small voltage drops, across the input/output terminal pins of the multilayer wiring substrate and the LSI power feeding portions (portions where the LSI's are connected to the substrate).

However, as LSI's consume increased amounts of electric power due to higher density fabrication techniques, electric current flows in increased amounts into the LSI's and the drop in voltage increases due to impedance of the power source wiring.

Japanese Patent Laid-Open No. 22394/1985 discloses a wiring substrate adapted to a high-density multi-package. In this patent the sectional are of the through-hole wiring that connects the input/output terminal pins on the back surface to the power source wiring layer in the multilayer ceramic substrate formed by laminating green sheets, is selected to be greater than the sectional area of the through-hole wiring that penetrates through the power source wiring layer; this is done in order to decrease dc resistance of the power source wiring and to decrease the drop in voltage. According to this technology, it is allowed to decrease the drop in voltage in the multi-chip package. However, no attention has been given to variance in potential in the LSI feeding portions. Therefore, when LSI's that consume large amounts of electric power and LSI's that consume small amounts of electric power are mounted in a mixed manner on the multilayer wiring substrate, it is not possible to uniformalize the potential at the LSI feeding portions. That is, according to this technology, though the resistance is reduced across the input/output terminal pins and the power source wiring layer, the voltage drops in different amounts in the power source wirings connected to the individual LSI's depending upon the consumption of electric power. Accordingly, the voltage increases at the power feeding portions of those LSI's that consume large amounts of electric power and the voltage decreases at the power feeding portions of those LSI's that consume small amounts of electric power. Difference in the power source voltage among the LSI's greatly decreases the operation margin.

Current ceramic substrate technology offers improvements in the multilayer substrate to solve these problems and provides a multilayer substrate that minimizes differences in the power source voltage among the chips.

SUMMARY OF INVENTION

The object of the present invention is to provide a multilayer wiring substrate which suppresses variance in potential at the LSI feeding portions caused by the difference in the amount of electric power consumed by the electronic parts that are mounted.

According to the present invention, a multilayer wiring substrate which mounts a plurality of electronic parts on the surface thereof comprises includes feeding points that are provided on the surface of the substrate to feed electric power to the electronic parts, a plurality of feeding paths that are connected to said feeding points and are independently provided for each of the electronic parts, and resistance means that are provided in said plurality of feeding paths and that have resistances determined in advance depending upon the power consumptions of the electronic parts corresponding to said feeding paths, such that the voltage is uniformalized to a desired value at all feeding points.

According to the present invention, resistances of the feeder circuits can be decreased depending upon the power consumption of the electronic parts, for example, by changing the number of power source through-holes in the multilayer wiring substrate, by changing the diameter of the power source through-holes of the multilayer wiring substrate, or by changing the shape of connection of the power source layers of the multilayer wiring substrate.

The resistances may be decreased in only those feeder circuits connected to the electronic parts that consume large amounts of electric power. For instance, the resistance may be maintained constant in those feeder circuits connected to the electronic parts whose power consumption does not exceed a predetermined level, and the resistance may be decreased in only those feeder circuits connected to the electronic parts whose power consumption exceeds a predetermined level, the resistance being decreased depending upon the degree of consumption of electric power.

According to the present invention, furthermore, the resistance may be decreased not in perfect proportion to the consumption of electric power but in a stepwise manner. For instance, predetermined feeder circuits are used up to a predetermined level of power consumption, and the number of through-holes is doubled for those whose power consumption is greater than the above, and the number of through-holes is tripled for those that consume electric power in much larger amounts.

BRIEF DESCRIPTION OF DRAWINGS

The invention may take physical form in certain parts and arrangements of parts which will be described in detail in this specification and illustrated in the accompanying drawings which form a part thereof and wherein.

BEST MODE FOR CARRYING OUT THE DETAILED DESCRIPTION OF THE INVENTION

Figure 1:
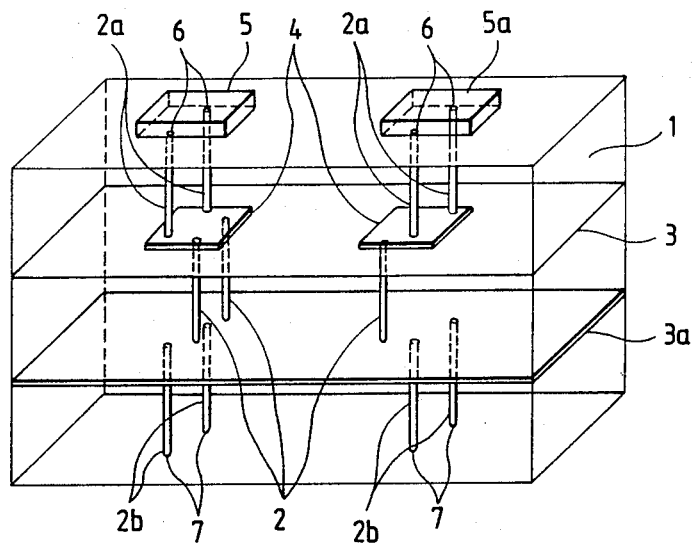
FIG. 1 is a perspective view of a multilayer wiring substrate according to an embodiment of the present invention.
Figure 2:
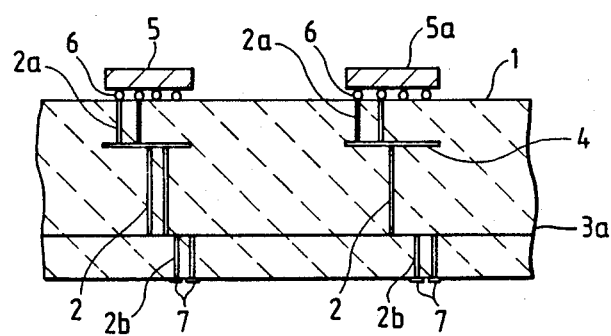
FIG. 2 is a section view of the multilayer wiring substrate.

FIGS. 1 and 2 illustrate a multilayer wiring substrate according to the present invention. The multilayer wiring substrate 1 has power source through-holes 2, 2a, 2b and power source layers 3, 3a, and mounts for a plurality of LSI's 5, 5a. The power source layer 3a is a spreading layer having a power source conductor that spreads over the whole multilayer wiring substrate to spread the power source from the feeding points 7 over the whole substrate. Therefore, the power source from the feeding points 7 exists under any LSI on the multilayer wiring substrate. As required, furthermore, through-holes may be formed to supply the electric power. The power source conductor 4 which conducts power from the power source layer 3a corresponds to the LSI, and works to uniformalize the power source from the through-hole 2 to the corresponding LSI. The through-holes can be formed in the power source conductor 4 from any feeding point of the LSI to obtain the same voltage.

The electric power is fed to the LSI's 5, 5a from the feeding points 7 of the multilayer wiring substrate via the power source through-hole 2b, power source layer 3a, power source through-holes 2a, and LSI feeding portions 6.

In order that a desired uniform voltage is applied to every LSI through the LSI feeding portions 6 irrespective of the consumption of electric power by the LSI's 5, 5a that are mounted, the number of power source through-holes 2 is determined in proportion to the consumption of electric power by the LSI's 5, 5a to adjust the resistance between the power source layer 3a and the power source conductor 4. For instance, when the LSI 5 consumes the electric power in an amount twice as great as that of the LSI 5a, the number of power source through-holes is selected to be two for the LSI 5 and only one power source through-hole is formed for the LSI 5a. Therefore, the LSI 5a has an increased resistance between the power source layer 3a and the power source conductor 4.

Figure 3:
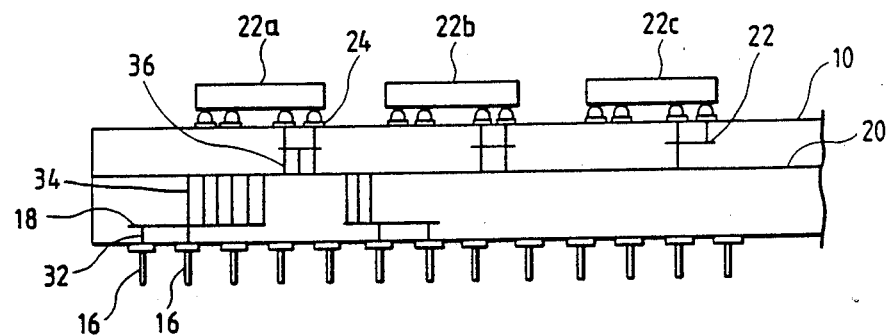
FIG. 3 is a section view of the multilayer wiring substrate according to another embodiment of the present invention.

FIG. 3 illustrates another embodiment of the present invention. In the multilayer wiring substrate 10 of this embodiment, the number of power source through-holes 36 is changed depending upon the consumption of electric power by the LSI's 22a, 22b, 22c.

In FIG. 3, the LSI 22a consumes the electric power in the greatest amount and the LSI 22c consumes the electric power in the smallest amount. The power source supplied through power source pins 16 is given to the power source conductor 18 via the through-holes 32. The power source conductor 18 is connected to a power source conductor 20 via a plurality of through-holes 34. As in the aforementioned embodiment, the power source conductor 20 is spread over the whole multilayer wiring substrate. A power source conductor 22 is provided for each of the LSI's and works to uniformalize the power source; i.e., the voltage applied through the plurality of through-holes 36 is uniformalized before being applied to the LSI's. In FIG. 3, the LSI 22a that consumes the electric power in the greatest amount is located closer to the power source pins 16 than the LSI 22c that consumes the electric power in the smallest amount. The resistance can thus be adjusted. That is, the mounting positions are so designed that the LSI's that consume electric power in large amounts are mounted at positions close to the power source pins 16 and the LSI's that consume electric power in small amounts are mounted at positions remote from the power source pins 16.

The resistance is thus adjusted and the voltage is uniformalized at feeding pads of the LSI's.

Figure 4:
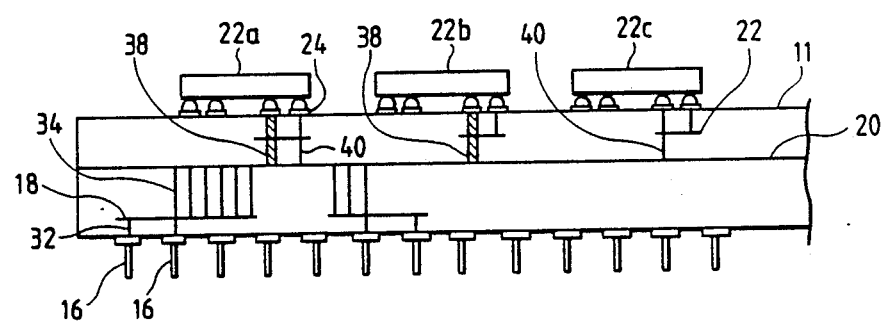
FIG. 4 is a section view of the multilayer wiring substrate according to a further embodiment of the present invention.

FIG. 4 illustrates a further embodiment of the present invention. In the multilayer wiring substrate 10 of this embodiment, the diameter of power source through-holes is changed depending upon the power consumption of the LSI's 22a, 22b, 22c, and the number of through-holes is also changed.

In FIG. 4, the portions which are the same as those of FIG. 3 are denoted by a similar reference numeral. In this embodiment, the power source conductor 20 and the power source conductor 22 are connected together via the through-holes 38 and 40 having dissimilar diameters instead of using the plurality of through-holes 36.

In this embodiment, the voltage at the feeding portions 24 of the LSI's is adjusted based on the diameters of the through-holes 38 and 40. That is, through-holes 38 with a large diameter are used for the LSI 22a that consumes electric power in large amounts and a through-hole 40 with a small diameter is used for the LSI 22c that consumes electric power in small amounts.

When, for example, the LSI 22b consumes the electric power in an amount twice as great as that of the LSI 22c, the diameter of the through-holes 38 be increased by $\sqrt{2}$ times (1.41 times) compared with that of the through-holes 40. Further, when the LSI 22a consumes the electric power in an amount three times as great as that of the LSI 22c, the resistance is adjusted by the combination of the through-holes 38 and the through-holes 40.

As a result, the resistance is adjusted by the through-holes 38 and 40, and the voltage is uniformalized at the feeding pads 24 of the LSI's. Here, forming the through-holes having various diameters results in the complexity in the punching operation. Therefore, the through-holes should be formed having, diameters of various sizes.

Further, adjustments to the resistance can be accomplished by changing the width of the power source conductors (4, 22) in proportion to the consumption of electric power.

When the plurality of LSI's consume electric power in different amounts in the above-mentioned embodiment, then the LSI's may be divided into groups to determine the resistance.

For instance, only one power source through-holes is formed for each of the LSI's of the group that consumes electric power in amounts of not greater than 15 watts, two power source through-holes are formed for each of the LSI's of the group that consumes electric power in amounts of from 15 to 25 watts, and three power source through-holes are formed for each of the LSI's of the group that consumes electric power in amounts of greater than 25 watts. It is also allowable to change the diameter of the power source through-holes for the LSI's of each of the groups.

According to the present invention, the voltage at the feeding points of electronic parts on the multilayer wiring substrate is uniformalized into a desired value making it possible to maintain an acceptable operating margin.

What is claimed is:

1. An electronic parts mounting apparatus for mounting a plurality of electronic parts of different types, the apparatus comprising:
   a multilayer substrate having a first surface;
   a plurality of feeding portions attached to the first surface receiving the electronic parts;
   a feeding point attached to a second surface of the multilayer substrate, the feeding point allowing external electronic power to be accepted by the mounting apparatus;
   a first through-hole wiring on the substrate in contact with the feeding point to transfer the external electronic power from the feeding point;
   a common power source layer of the same area as the substrate first surface forming an intermediate layer of the multilayer substrate in contact with the first through-hole wiring;
   a plurality of second through-hole wirings in contact with the common power source layer, the second through-hole wirings extending from the common power source layer;
   a plurality of third through-hole wirings connected to at least one of the feeding portions; and,
   a plurality of conductors located under the electronic parts between the first surface and the common power source layer, the conductors provided in a one to one correspondence with the electronic parts, the conductor having first and second sides, the first side in contact with an end of selected ones of the second through-hole wirings and the second side in contact with an end of at least one of the plurality of third through-hole wirings, wherein the selected number of the second through-hole wirings is determined based on the type of the electronic parts, whereby the number of the second through-hole wirings transferring the external electronic power to a certain type of the electronic parts is different from that of the through-hole wirings transferring the external power to a different type of the electronic parts.

2. A module substrate which mounts a plurality of electronic parts on the surface thereof, the module substrate comprising:
   feeding portions provided on the surface of the substrate which feed electric power to the plurality of electronic parts;
   a plurality of uniformalizing conductor layers connected to said feeding portions via a plurality of through-hole wirings, said conductor layers arranged under the electronic parts in a corresponding one to one relationship;
   the plurality of through-hole wirings each having one of a plurality of predetermined resistances based upon previously known power consumption of the electronic parts that correspond to said uniformalizing conductor layers;
   a conductor layer of the same area as an entire surface of the substrate within the module, connected to the uniformalizing conductor layers via the plurality of through-hole wirings; and,
   power source pins provided on a back surface of said module substrate to connect an external power source to said spreading conductor layer via the through-hole wirings.

3. The module substrate according to claim 2, wherein said through-hole wirings have varying diameters one side of said plurality of through-holes being connected to said spreading conductor layer and another side thereof being connected to said uniformalizing conductor layers.

4. The module substrate according to claim 2, wherein said plurality of electronic parts are classified into a plurality of groups depending upon their power consumptions, and resistances of said resistance means are determined depending upon to which group the corresponding electronic parts pertains.

5. A multilayer mounting apparatus for mounting electronic parts, the apparatus comprising;
   a wiring substrate having a first surface;
   a plurality of feeding portions located on the first surface, the plurality of feeding portions receiving the electronic parts;
   a plurality of feeding points located on a second surface of the wiring substrate, the plurality of feeding points allowing an external electronic power to be accepted by the mounting apparatus;
   a plurality of through-hole wirings defined within selected areas of the wiring substrate, interconnecting the plurality of feeding points to the plurality of feeding portions, whereby the electronic parts are provided with electric power;
   a common power source layer of the same area as the substrate first surface forming an intermediate layer of the substrate and being in contact with the through-hole wirings connected to the feeding points; and,
   a plurality of conductors each located under a corresponding one of the electronic parts between the first surface and the common power source layer, the conductors each being configured to a size substantially equivalent to the corresponding electronic part, the conductors having a first side in contact with an end of at least one of the through-hole wirings connected to the power source layer, and a second side in contact with an end of at least one through-hole wiring in contact with one of the plurality of feeding portions, such that transfer of electric power from the feeding points to the feeding portions is accomplished.

6. The multilayer electronic parts mounting apparatus as set forth in claim 5 wherein the wiring substrate is comprised of a ceramic material.

7. The multilayer mounting apparatus as set forth in claim 5, wherein the power source layer encompasses an entire horizontal level of the wiring substrate such that the electric power from the feeding points is spread over the entire horizontal level of the wiring substrate.

8. The multilayer mounting apparatus as set forth in claim 5, wherein the plurality of through-hole wirings are of varying diameters.

9. The multilayer mounting apparatus as set forth in claim 5, wherein the through-hole wirings each have one of a plurality of predetermined resistance based upon power consumption of the electronic parts corresponding to the feeding paths.

* * * * *